United States Patent [19]

DeBar et al.

[11] Patent Number: 4,965,512
[45] Date of Patent: Oct. 23, 1990

[54] TRANSIENT CURRENT PEAK DETECTOR

[75] Inventors: David E. DeBar; Indravadan J. Shah, both of Manassas, Va.

[73] Assignee: International Business Machines Corporation, Armonk, N.Y.

[21] Appl. No.: 429,736

[22] Filed: Oct. 18, 1989

[51] Int. Cl.$^5$ ..................... G01R 19/16; H03K 5/153
[52] U.S. Cl. ........................... 324/103 P; 324/158 R; 324/103 R; 307/351; 328/151
[58] Field of Search ........... 324/103 P, 103 R, 158 R; 307/351, 359; 328/116, 151

[56] References Cited

U.S. PATENT DOCUMENTS

| | | | |
|---|---|---|---|
| 2,836,356 | 5/1958 | Forrest et al. | 324/103 P |
| 3,656,152 | 4/1972 | Gundersen | 340/347 |
| 3,766,411 | 10/1973 | Arnold | 307/231 |
| 3,777,263 | 12/1973 | Perron et al. | 324/103 P |
| 4,121,119 | 10/1978 | Meigs et al. | 307/351 |
| 4,246,571 | 1/1981 | Gariazzo | 341/143 |
| 4,401,898 | 8/1983 | Sommerer | 307/351 |
| 4,560,940 | 12/1985 | Van Der Schans | 307/359 |
| 4,613,769 | 9/1986 | Gross et al. | 307/351 |

OTHER PUBLICATIONS

D. B. White, "Peak Detector for High Speed Semi--Repetitive Voltage Peaks", *IBM Technical Disclosure Bulletin*, 8/79, pp. 1118–1119.
D. C. Flemming, "Image Registration Detection System", *IBM Technical Disclosure Bulletin*, 11/62, pp. 57–60.
E. Lee, et al., "Dynamic Dimensional Measuring", *IBM Technical Disclosure Bulletin*, 3/67, pp. 34–35.
S. E. Hoaby, "Peak Acquisition Circuit", *IBM Technical Disclosure*, 11/85, pp. 2354–2355.

*Primary Examiner*—Reinhard J. Eisenzopf
*Assistant Examiner*—Vinh P. Nguyen
*Attorney, Agent, or Firm*—John E. Hoel; Mark A. Wurm

[57] ABSTRACT

The current peak detector can be described as four separate sections. The first section is power distribution. The second is the analog section where the Idd current transient peak is first detected. There are two analog sections, one for Idd internal, and another for Idd external. The third section is the automatic multiplexer that controls which of the two analog sections will drive the digital section. The fourth and final section is the digital section where a voltage that is analogous to the peak current is converted to a DC voltage level with infinite memory. The digital section performs the logic function of replacing any prior digitized voltage peak with any higher voltage peak that may occur during the test period.

3 Claims, 6 Drawing Sheets

TRANSIENT CURRENT PEAK DETECTOR

BACKGROUND OF THE INVENTION

1. Technical Field

The invention disclosed broadly relates to testing circuits and more particularly relates to a testing circuit for measuring very short duration current peaks.

2. Background Art

It is known in the industry that CMOS devices can draw large Idd current surges at maximum functional speed. These current surges can be due to inherent conditions during switching where the N-channel and the P-channel of a given device pair are both on momentarily or these current surges can be due to device defects. The device under test (DUT) may pass all functional parametric tests and indeed may perform the functions it was designed to do. However the problem is one of reliability due to this excessive surge current. The occurrence of large current transients is detrimental to the life of VLSI devices.

Current state of the art VLSI automatic test equipment (ATE) does not offer the capability to measure large, short duration, current transients occurring in CMOS VLSI devices.

OBJECTS OF THE INVENTION

It is therefore an object of the invention to provide an improved transient peak detector for measuring currents.

It is another object of the invention to provide an improved transient current peak detector capable of measuring large, short duration, current transients occurring in complementary MOS VLSI devices.

SUMMARY OF THE INVENTION

These and other objects, features and advantages of the invention are accomplished by the transient current peak detector disclosed herein. A transient current peak detector circuit is disclosed including a comparator having a new voltage amplitude representing a current peak applied to its positive side and a feedback voltage applied to its negative side, with the feedback voltage characterizing a past peak signal amplitude. The comparator includes a binary output which is applied to an analog-to-digital converter to digitize the new voltage amplitude when a new high value is detected for the new voltage amplitude at the input. The analog-to-digital converter includes flip-flop storage cells for each binary digit of its output, which store the digital representation of the new high value. The digital-to-analog converter has its inputs connected to the outputs of the analog-to-digital converter, for reconstituting the analog DC level stored in the analog-to-digital converter flip-flops. A circuit is included for adding a small increment voltage to the reconstructed level out of the digital-to-analog converter and feeding back the sum amplitude as the feedback voltage applied to the negative terminal of said comparator. In this manner, a peak value for an input current waveform can be measured.

The Idd peak detector can be described as four separate sections. The first section is power distribution. The second is the analog section where the transient Idd current peak is first detected. There are two analog sections, one for internal logic circuits on the DUT, and another for external circuits such as off-chip drivers (OCD). The third section is the automatic multiplexer that controls which of the two analog sections will have its output monitored. The fourth and final section is the digital section where a voltage from the multiplexer that is analogous to the peak current is converted to a DC voltage level with infinite memory. The digital section performs the logic function of replacing any prior digitized voltage peak with any higher voltage peak that may occur during the test period.

The invention performs a two step process of first capturing a fast transient in the analog peak detector, stretching out that peak, in time, long enough so that the peak can be digitized before it degrades significantly. The multiplexer can automatically (without computer help or delays) seek out the largest input and direct that input to the output in that same brief period of time that the peak is being transferred from the analog section to the digital section. The invention performs a very fast transfer of the peak from the analog sections through the multiplexer to the digitizer.

BRIEF DESCRIPTION OF THE DRAWINGS

These and other objects, features and advantages of the invention can be more fully appreciated with reference to the accompanying figures.

FIG. 6 is a diagram of output voltage in response to current pulses in.

DESCRIPTION OF THE BEST MODE FOR CARRYING OUT THE INVENTION

Figure 1:
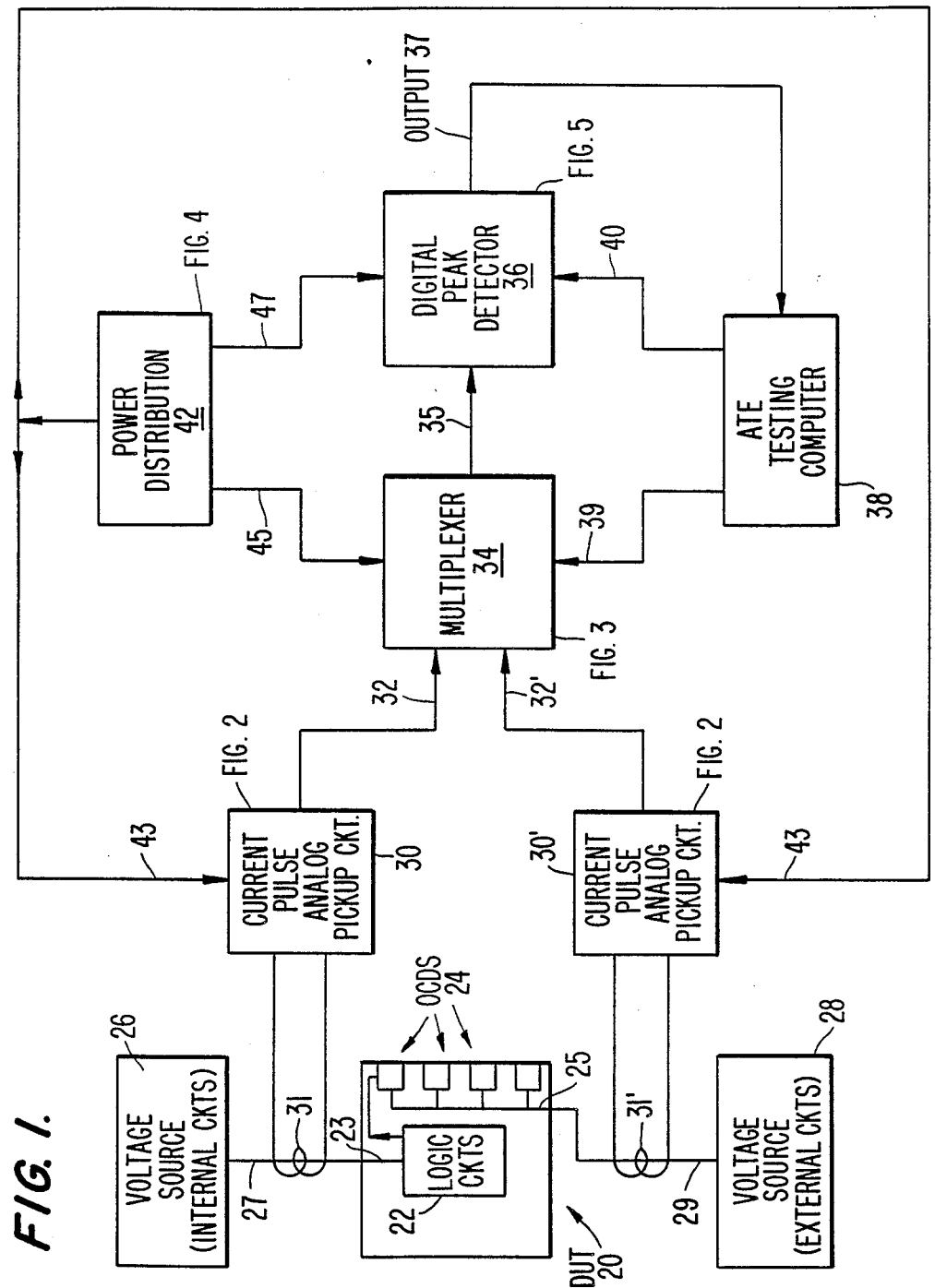
FIG. 1 is a functional block diagram of the test system.

FIG. 1 is an overall functional block diagram of the transient current peak detector. A device under test (DUT) 20 can be a very large scale integrated circuit which has many logic circuits 22 located within the interior of the chip area which obtained their power from a first voltage source 26 for internal circuits, which is connected by means of line 27 to the pad 23 on the chip. Located along the periphery of the DUT 20 will be large driver circuits such as the off-chip drivers (OCDs) 24 which receive digital signals from the interior logic circuits 22, amplify those signals and present them at signal pads along the periphery of the chip for communication to outside circuits. Since the switching of off-chip driver circuits 24 typically can generate noise which can disturb the operation of logic circuits 22, many chip designs include a separate, independent voltage source 28 for external circuits which will provide the power for external circuits such as OCDs 24. The second voltage source 28 will provide its power over line 29 to the pad 25 for distribution to the external circuits on the chip, such as the OCDs 24.

Since current surges can occur in the line 27 providing power to the internal logic circuits 22 due to the simultaneous switching of many of the circuits 22, it is desirable to be able to test for the occurrence of such current surges. This is provided, in accordance with the invention, by means of a current transducer 31, in close proximity with the line 27, which provides a signal to the current pulse analog pick-up circuit 30 when current surges occur in line 27. Similarly, when several OCDs 24 switch simultaneously, current surges can occur in the line 29 providing power to those external circuits on the DUT 20. In order to test for such transient currents, the current transducer 31', which is similar to 31, is positioned in close proximity with the line 29, and it provides a signal to the current pulse analog pick-up circuit 30' when the transient current appears in the line 29.

Figure 2:
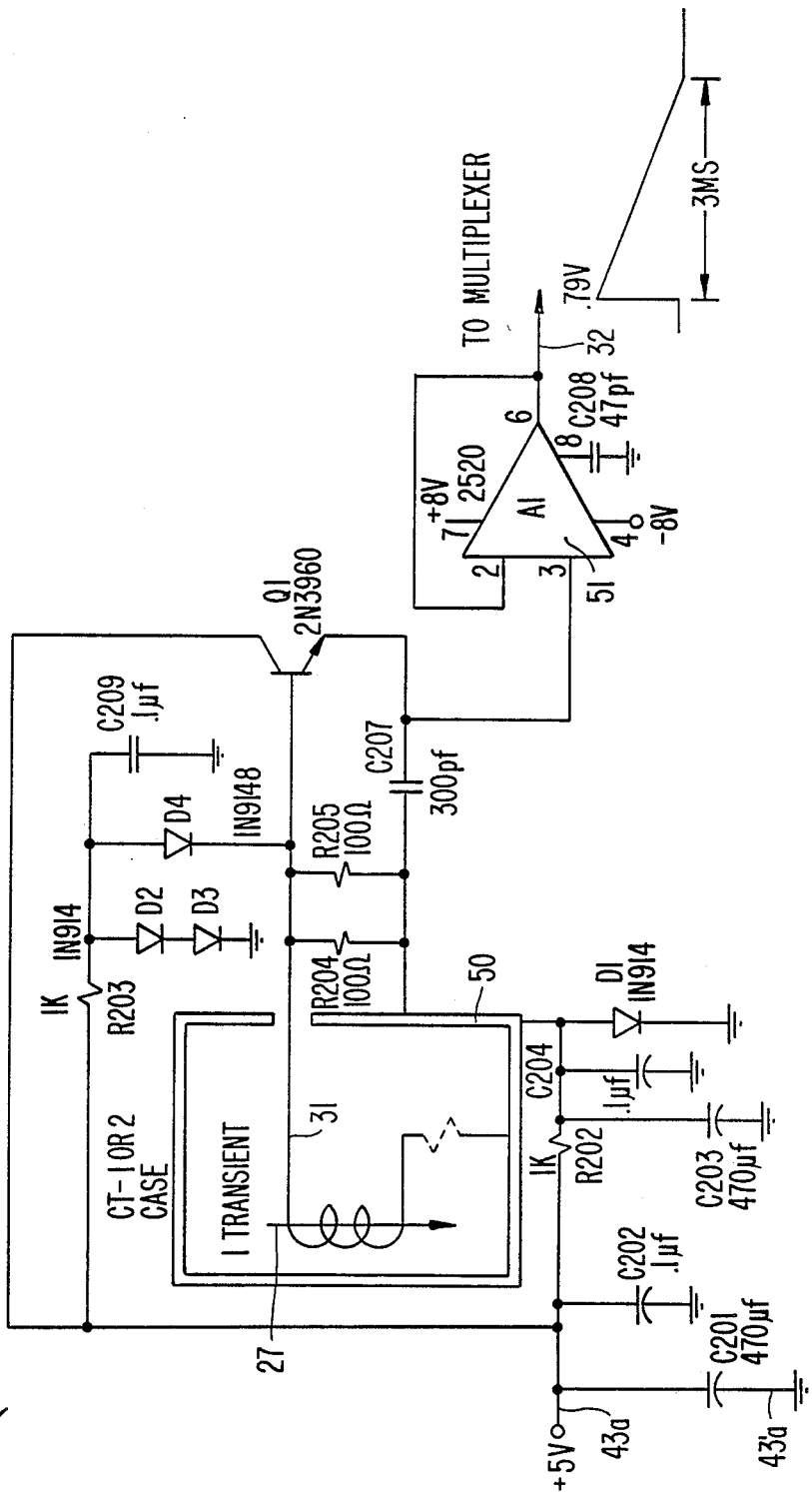
FIG. 2 is a circuit schematic diagram illustrating the analog section 30.

The current pulse analog pick-up circuit 30 or 30' is shown in a more detailed illustration in FIG. 2. In accordance with the invention, it is desirable to be able to automatically detect transient current peaks from either the line 27 for internal circuits or alternately from line 29 for external circuits. Thus, the multiplexer 34 is provided as shown in more detail in FIG. 3, which accepts line 32 from the first current pulse analog pick-up circuit 30 and it accepts line 32' from the second current pulse analog pick-up circuit 30'. The multiplexer 34 can automatically direct a current pulse representation on either line 32 or line 32'to its output 35. The automatic test equipment (ATE) testing computer 38 has control line 39 to the multiplexer 34, to select whether the multiplexer will exclusively focus on analog pick-up circuit 30 or analog pick-up circuit 30' or alternately automatically select a signal from either 30 or 30'.

Figure 5:
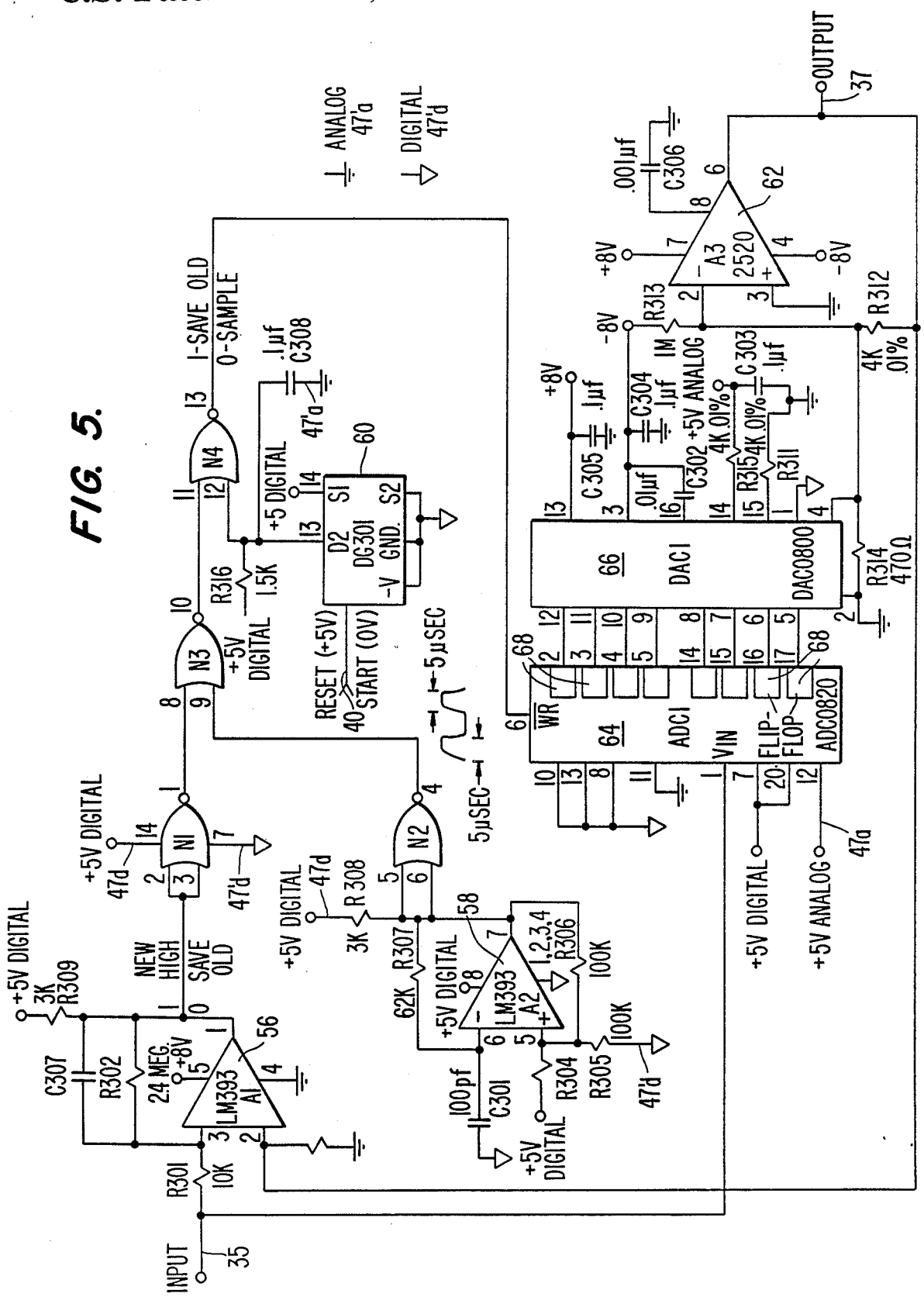
FIG. 5 is a circuit schematic diagram of the circuit 36 used to capture the output of the analog section, digitize and digitally store the peak voltage that occurs during the test period.

The analog signal output from the multiplexer 34 on line 35 is applied to the digital peak detector 36 which is shown in greater detail in FIG. 5. The digital peak detector circuit 36 will capture the output of the analog section 30 or 30', it will digitize and digitally store the peak voltage which occurs during a test period, and will provide that peak magnitude in analog form at the output 37. The output 37 can be applied to the ATE 38 or it can alternately be provided to other utilization devices.

Figure 3:
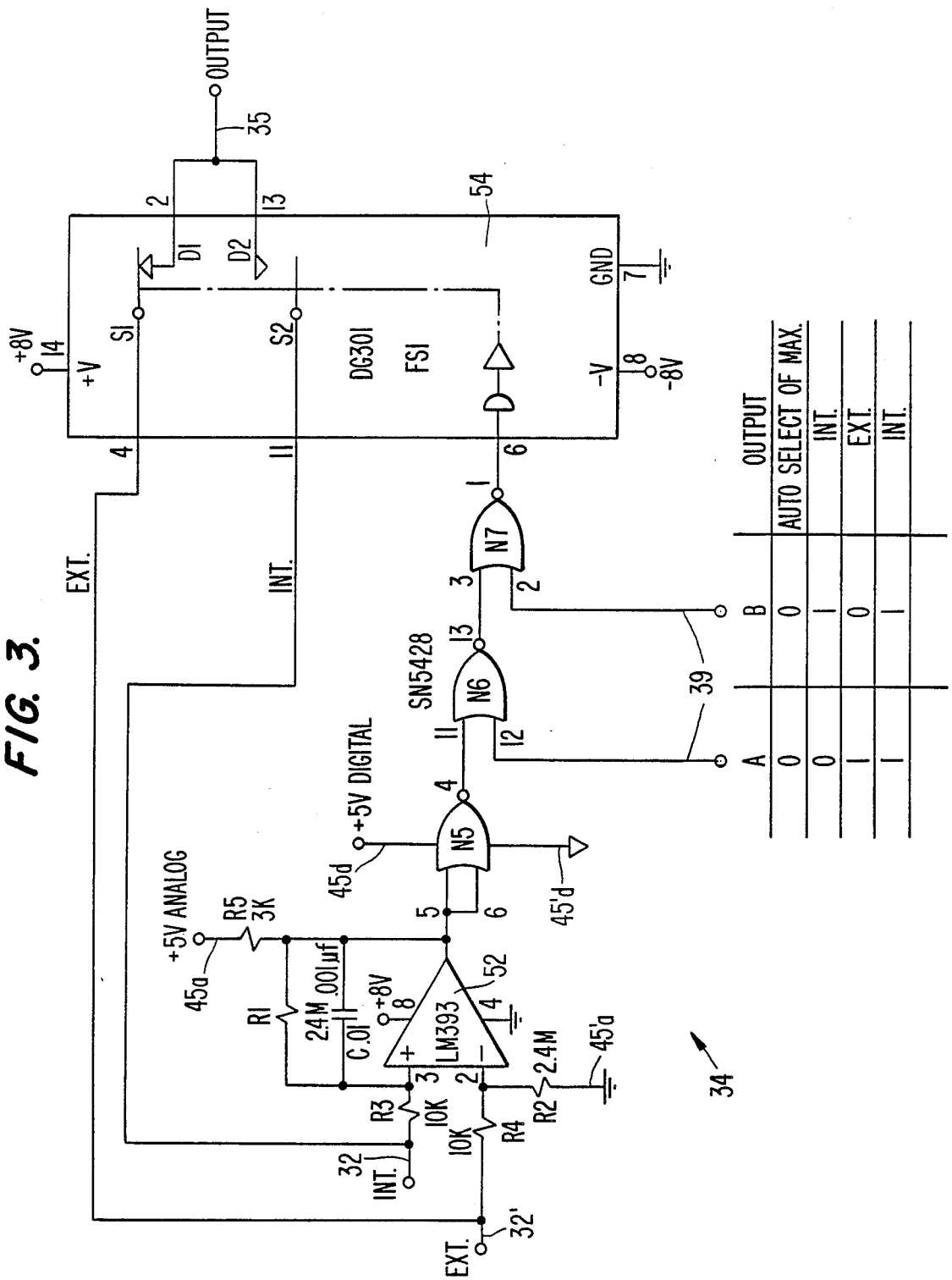
FIG. 3 is a circuit schematic diagram of the multiplexer circuit 34.

Since it is desired to detect very small magnitude transient current pulses of a very short duration, noise from a variety of sources can prevent such a measurement. In accordance with the invention, a special power distribution circuit 42 is provided which is shown in greater detail in FIG. 4. The power distribution circuit 42 provides operating voltage on line 43 to the analog pick-up circuit 30 and 30', on line 45 to the multiplexer 34, in line 47 to the digital peak detector 36. Circuits characterized as digital circuits are separately powered from other circuits characterized as analog circuits in the analog pick-up circuit 30, 30', the multiplexer 34, and the digital peak detector circuit 36. As an example of this, FIG. 3 shows the multiplexer circuit wherein the +5 volt analog voltage is supplied on line 45a and the ground analog voltage is supplied on line 45a'. This is from a different portion of the power distribution circuit in FIG. 4 than is the +5 volt digital voltage supplied on line 45d and the ground digital voltage as supplied on line 45d'. A similar notation is used for line 47 to the digital peak detector circuit 36 of FIG. 5.

Figure 4:
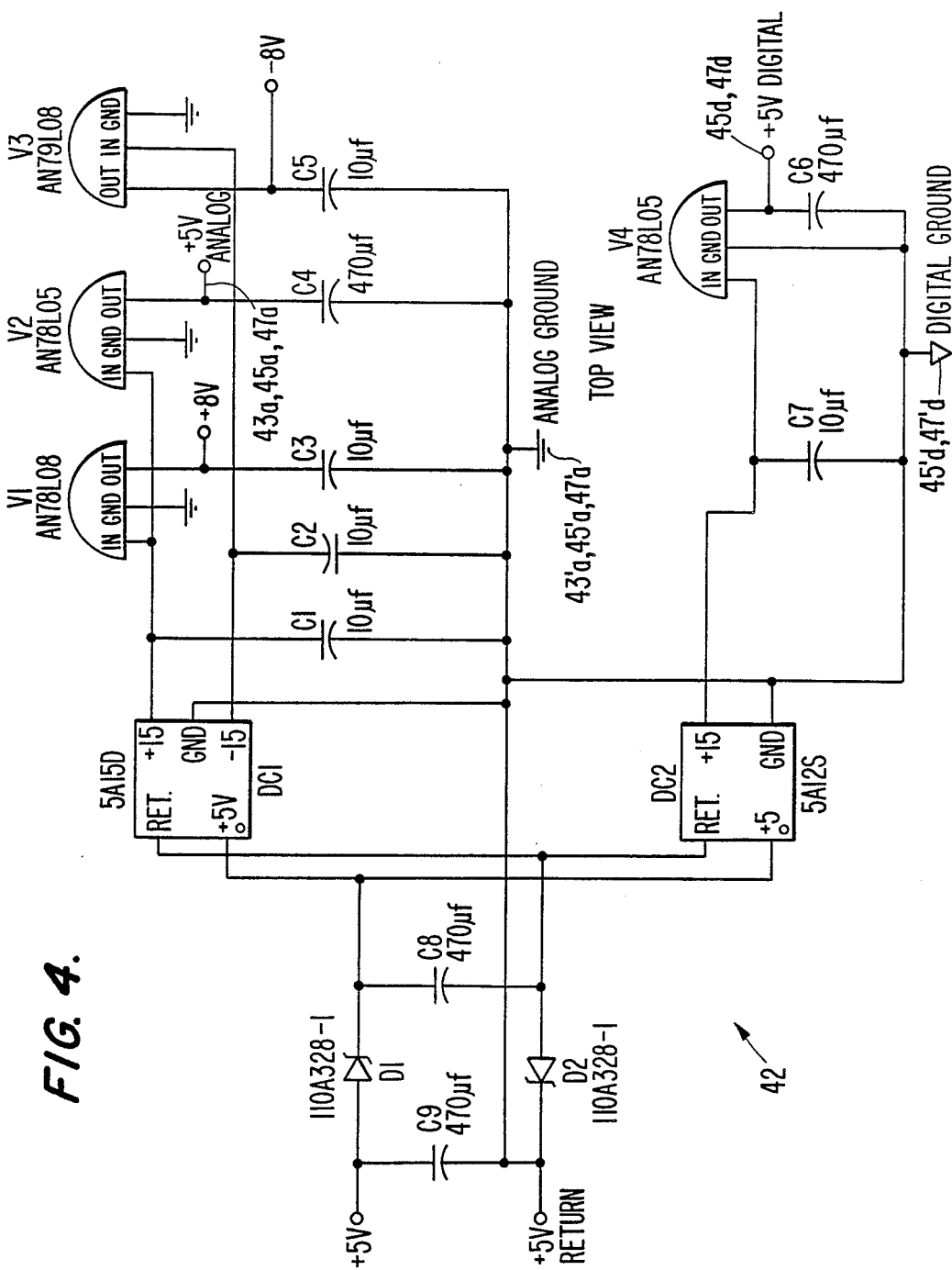
FIG. 4 is a circuit schematic diagram illustrating power distribution 42.

FIG. 4 shows how the needed voltage sources of +5 volts analog, +5 volts digital, and ±8 volts analog are provided. Note that analog and digital grounds are kept separate to prevent noise coupling. DC1 and DC2 are commercially available DC to DC converters. When the DC to DC converters are provided with five volts input voltage they provide ±15 volts (unregulated and ungrounded) outputs. Separate DC to DC converters were used for the analog and digital portions of the circuit. High power Schottky barrier diodes D1 and D2 were placed in the +5 volt source provided by the tester and in the +5 volt return path to the tester. The diodes D1 and D2 in conjunction with capacitors C9 and C8 prevent noise that is generated by the DC to DC converters from coupling back into the tester. Voltage regulators V1, V2, V3, and V4 along with their associated capacitors provide the regulated voltage sources needed by the rest of the circuit.

FIG. 2 shows the current pulse analog pick-up circuit 30 or 30' used to capture the positive peak of an Idd current transient and hold it for 20 microseconds. Component 50 is a shielded current transducer that provides a one-to-one current to voltage conversion of current transients and has a response time of 500 picoseconds over a frequency range 1.2 KHz to 200 MHz. The conducting line 27 that provides Idd, is passed through the current sensing coil 31. The case of the transducer 50 is raised one diode drop above analog ground by diode D1. Diode D1 provides thermal correction and signal bias to correct for the diode voltage drop caused by the base emitter junction of transistor Q1. Transistor Q1 2N3960 is a 1.8 GHz NPN transistor with BVbeo=4.5 volts. The output of coil 31 is terminated by 50 ohm resistor combination of R204 and R205 and the base of Q1. Transistor Q1 charges capacitor C207 (300 pf polystyrene) to a voltage analogous to the positive peak of the Idd current transient on line 27. Once C207 is charged, the charge is trapped by the back biased base emitter junction of Q1. The only discharge path for C207 is a very small constant current (10 nA) into the non-inverting input of operational amplifier 51. Less than one percent of the charge stored on C207 discharges in 10 microseconds. Capacitors C201 and C202 provide decoupling of the +5 volts applied to resistor R203. Capacitors C203 and C204 provide decoupling of voltage developed across Q1. Capacitors C201 and C202 also provide decoupling of the +5 volts applied from line 43a to the collector of Q1 and to one side of resistor R202. Resistor R202 limits the current that flows through D1 and adjusts the bias point of Q1 to match the base emitter junction of Q1 when at the verge of conduction. The value of R202 is determined by selecting a value that causes a very small positive voltage (20 mV) at the emitter of Q1 when Idd is zero. Should the voltage established by diode D1 change due to variations in ambient temperature the base emitter junction of Q1 will change a like amount in the same direction, hence Q1 and D1 temperature compensate for each other. The maximum voltage that can be stored on capacitor C207 is limited by the reverse base to emitter breakdown voltage of transistor Q1 and the most negative voltage that can exist at the base of Q1. Diode D4 clips any negative going undershoot. Diodes D2 and D3 and R203 establish bias for diode D4. The maximum voltage that can be stored on C207 is 4.5 volts. Operational amplifier 51 provides a high impedance buffer between the output of the analog section 30 and the input to the digital section 36. Capacitor C208 (47 pf) on pin 8 of amplifier 51 over-damps the response of amplifier 51 to assure that there is no voltage overshoot applied to the digital section 36. The declining ramp voltage waveform at output 32 is shown in FIG. 2. Its amplitude is proportional to the charge stored on capacitor C207 due to detected Idd peaks large enough to make Q1 conduct.

Typically there are two Idd paths 27 and 29 provided to the DUT 20. The first is the internal path 27 which supplies all combinatorial logic and latches 22. A second path 29 supplies current for all off-chip drivers 24. The two are separated to prevent noise coupling from one to the other. There is interest in knowing the peak current in both paths 27 and 29. FIG. 3 shows how the output from two analog peak detectors 30 and 30' are multiplexed into one digital peak detector 36. The multiplexing is done by multiplexer 34 in such a way as to provide three modes of operation, all under control of ATE 38. The first mode is the automatic mode in which the multiplexer 34 will automatically select whichever analog peak detector 30 or 30' is at the higher voltage. The second mode always selects circuit 30 for Idd internal. The third and final mode always selects circuit 30' for Idd external.

FIG. 3 is the schematic drawing of the multiplexer circuit 34. Threshold detector 52 is a comparator connected to the outputs 32 and 32' of both the Idd internal analog detector 30 depicted as "INT" and the output of the Idd external analog detector 30' depicted as "EXT" via resistors R4 and R3, respectively. Resistor R5 provides pull-up for the output of the detector 52. R1, R3 and C1 provide needed hysteresis to prevent oscillation when INT and EXT are equal in voltage. The output of detector 52 is a logical one when EXT is greater than INT. The output of detector 52 is a logical zero when INT is greater than EXT. The three NOR gates provided by SN5428 provide logic control of the circuit and are driven by the ATE 38 over lines 39. See truth table in FIG. 3. When both logic control lines "A" and "B" are zero, the output of pin 13 of SN5428 is the logical inversion of the output of detector 52 and will control FET switch (DG301) 54 such that the output pins 2 and 13 will always be connected to whichever input 32' (EXT) or 32 (INT) is larger. If logic control line "A" is one and "B" is zero, the output will be locked to input 32 (INT). If logic control line "B" is one, the output will be locked to 32' (EXT) regardless of the logic state of control line "A."

The analog section 30 or 30' of the peak detector will retain peaks for relatively long periods of time. The analog section 30 or 30' will lose 20 mV (one LSB) in 600 microseconds. The multiplexer 34 will switch in less than 2 microseconds. Hence there is no loss of accuracy introduced by the multiplexer 34 when used as described.

FIG. 5 shows the circuit 36 used to capture the output of the analog section 30 or 30', digitize and digitally store the peak voltage that occurs during the test period. The output of the analog section 30 or 30' is simultaneously applied to the input (pin 1) of ADC1 analog-to-digital converter (ADC1) 64 and to the non-inverting input of comparator 56. Comparator 58 serves as an astable 500 KHz multivibrator that provides 5 microsecond clock pulses needed by the rest of the circuit. Digital-to-analog converter (DAC1) 66 in conjunction with operational amplifier 62 converts the output of analog-to-digital converter 64 back into an analog voltage.

Assume that we are starting with the output of operational amplifier 62 at a very small level such as 40 mV and that a 100 milliamp Idd transient has just occurred. One hundred millivolts will appear at comparator 56 via R301 which will be compared to aforementioned 40 mV. Because 100 mV is larger than 40 mV the output of the comparator 56 will switch to a logical 1 (+5 volts). A portion of the logical 5 volt level is fed back via R302 to the non-inverting input of comparator 56, reinforcing the transition and providing hysteresis and stability and preventing bounce. The hysteresis characteristic is needed to prevent comparator 56 from responding to noise which would otherwise cause the circuit to track C207 of FIG. 2 as it slowly discharges. The logical 1 provided by comparator 56 is inverted by the NOR gate N1 and logical 0 is applied to pin 8 of NOR gate N3. With pin 8 of N3 at logical 0, the inverted clock pulses that are always provided at pin 9 of N3 from the inverting NOR N2, are allowed to pass through N3. Once out of N3 the clock pulses are applied to pin 11 of NOR gate N4. If FET switch 60 is closed and provides a logical 0 to pin 12 of N4, the clock pulses are once again inverted and appear at pin 13 of N4 and pin 6 of analog-to-digital converter 64. When analog-to-digital converter 64 receives negative going clock transitions at pin 6, it converts the analog voltage at pin 1 to an eight bit digital representation of that voltage on pins 2, 3, 4, 5, 14, 15, 16, 17. The digital output from analog-to-digital converter 64 is fed directly into the digital-to-analog converter 66 where it is converted back into an analog voltage (±20 mV accuracy). Resistor R313 provides a small positive offset to the output of operational amplifier 62 so that the output of 37 is always 20 mV more positive than the voltage that was just converted. The analog signal thus produced at 37 is fed back to comparator 56 on pin 2, the inverting side. Because the signal is slightly larger than the signal that is being applied at 35 to pin 3, the output comparator 56 switches to a logical zero, blocking any clock pulses from N2. A portion of the logical 0 (0 volts) at the output of comparator 56 is fed back via R302 again providing the needed hysteresis, this time in the negative direction. Once analog-to-digital converter 64 no longer receives clock pulses (negative transitions) it simply holds the eight bit digital value of the last voltage it converted when it was last receiving negative transitions. Each bit of the eight bit output of analog-to-digital converter 64 is stored in a respective output flip-flop 68. Hence the circuit serves as a digital latch remembering the largest voltage applied to the input pin 1 of analog-to-digital converter 64. In this example that voltage would be 120 mV (100 mV that was applied at 35 plus the constant additional 20 mV that is added by operational amplifier 62 for stability). Should another input pulse that is larger than 120 mV occur at 35, that voltage would replace the prior smaller one. The clock provides a new clock pulse at N2 every 10 microseconds (digital conversion takes 800 ns), thus providing a new opportunity to capture a new "high" every 10 microseconds. Since the analog section 30 or 30' has such a long relative time constant of over 3 milliseconds, less than one percent of a new "high" can leak off before it is captured by the digital section 36. The result is that Idd is continuously monitored.

FET switch 60 provides a means to reset the circuit to the minimum value. The test program running in ATE 38 stops any switching of the device under test 20 for a period of 5 milliseconds or longer to allow the analog section 30 or 30' to discharge to the minimum value (20 mV); then the tester 38 applies a logical 1 (+5 volts) on line 40 to pin 6 of FET switch 60 for at least 1 millisecond. This will force a positive transition at pin 13 causing analog-to-digital converter 64 to sample and hold the minimum voltage that is being applied at its pin 1. Capacitor C308 and resistor R316 establish a time constant that provides noise immunity and prevents false resets.

Two programs have been written to interface the ATE 38 with the Idd peak detector. The first of these programs is a subroutine entitled peakidd to condition the peak detector to clear its memory and make it ready to detect current transients, to select mode of operation (internal Idd/external Idd), to select the type of current transducer used, and to read the resulting output.

The second program is a utility entitled findidd that uses the "peakidd" program to perform a modified binary search that will find the first occurrence of a peak current pulse in a LSSD buffer. The address thus found can be used to determine what element in an integrated circuit device is causing large current transients.

Figure 6:
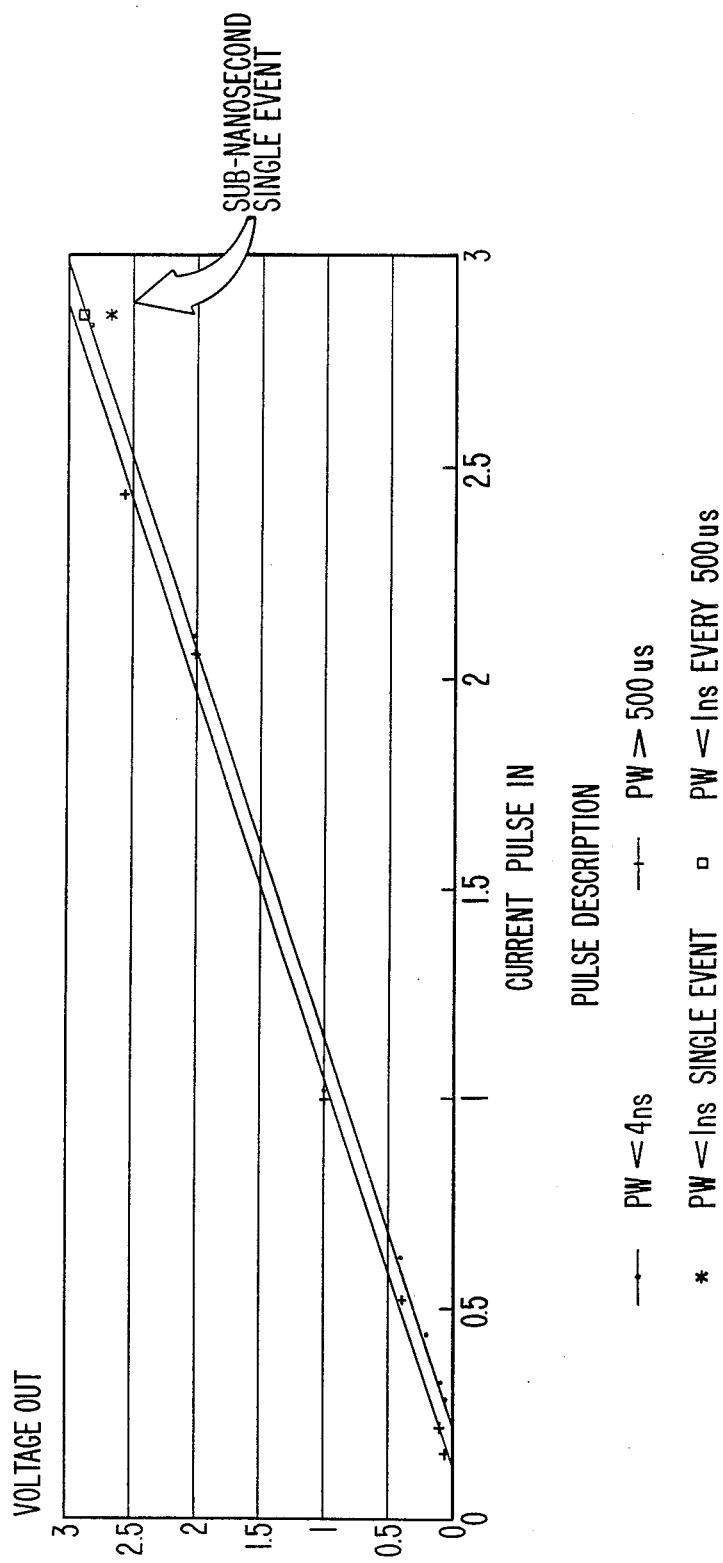

FIG. 6 is a graph of the transfer function of the overall circuit. Notice the very close agreement between the response to a very long pulse (500 ns) and very short pulses (4 ns). The solid line drawn through the dots provides an accuracy of ten percent ±100 mA over the range extending from 100 mA to 4 amps. Single event current pulses less than 3 ns cannot be detected to full accuracy; however, if the pulse occurs repeatedly and with a repetition rate of less than 500 microseconds, current transients of sub-nanosecond duration can be accurately measured.

The Idd peak detector can be mounted on a circular ring printed circuit board that attaches to the center of a tester performance board. It can be used with an elevated module socket or it can be used with wafer probes. The current transducers 50 are pluggable and can be turned over to measure negative current. Double ended pogo pins are used to complete the current path through the transducers, facilitating easy removal and minimizing lead length.

The resulting invention enables the VLSI automatic test equipment to detect and measure single event Idd current surges in the range of 50 milliamps to 4 amps that occur in CMOS devices and that typically last on the order of just a few nanoseconds.

Although a specific embodiment of the invention has been disclosed, it will be understood by those having skill in the art that changes can be made to those specific embodiments without departing from the spirit and the scope of the invention.

What is claimed is:

1. A transient current peak detector circuit, comprising:
   a comparator having a new signal amplitude representing a current peak applied to a positive side thereof and a feedback signal applied to a negative side thereof, said feedback signal characterizing a past peak signal amplitude;
   said comparator including a binary output which is applied to an analog-to-digital converter to digitize the new signal amplitude when a new high value is detected for the new signal amplitude at the input;
   said analog-to-digital converter including storage cells for each binary digit of its output, which store the digital representation of the new high value;
   a digital-to-analog converter having its inputs connected to the outputs of said analog-to-digital converter, for reconstituting an analog DC level from said representation stored in the analog-to-digital converter;
   means for adding a small increment voltage to the reconstructed level out of said digital-to-analog converter to procure a new reconstructed level and feeding back the new reconstructed level as said feedback signal applied to said negative terminal of said comparator;
   whereby a peak value for an input signal representing a current waveform can be measured.

2. A transient current peak detector circuit, for detecting current pulses in a power line connected to a device under test, comprising:
   a first current transducer operatively coupled to said power line, having an output terminal;
   an NPN bipolar transistor having its base connected to said output of said transducer, its collector connected to a positive reference potential, and its emitter coupled to a first node;
   a storage capacitor having a first plate coupled to said first node and a second plate coupled to a second reference potential;
   a comparator having a first input connected to said first node, a second input and an output, for providing a binary level signal at said output when said first input has a greater potential than said second input thereof;
   a two-input gate having a first input connected to said output of said comparator and a second input connected to a source of periodic clock pulses, and having an output terminal, for transferring said clock pulses to said output terminal thereof when said comparator applies an on signal to said first input of said gate;
   an analog-to-digital converter having an enabling input connected to said output of said gate and having a signal input coupled to said first node, and having a plurality of binary bit outputs which represent in digital form the analog value of a signal applied at the input thereof;
   a digital-to-analog converter having a plurality of binary bits inputs, each respectively coupled to a corresponding one of said plurality of binary bit outputs of said analog-to-digital converter, and further having an analog output, for outputting an analog signal having a magnitude corresponding to a digital value stored in said analog-to-digital converter corresponding to the analog signal applied at the input thereof;
   a voltage incrementing means having an input connected to the output of said digital-to-analog converter, and an output, for applying a fixed incremental voltage to said analog signal output from said digital-to-analog converter, said incrementing means having its output connected to said second input of said comparator;
   said comparator continuing to output an on-state signal from its output until said signal output from said incrementing means is greater in magnitude than said signal input to said first input of said comparator, at which point said comparator outputs an off-state signal thereby disabling said gate and preventing said clock signals from being transferred to said enable input of said analog-to-digital converter;
   said analog-to-digital converter at that point having a digital value stored therein corresponding to the peak value of a transient current pulse detected by said current transducer coupled to said power line.

3. The transient current peak detector circuit of claim 2, which further comprises:
   a second current transducer for a second power line connected to said device under test;

a multiplexer coupled to said first and second current transducers and connected to said first node, and having an output coupled to said first input of said comparator, for automatically coupling either said first current transducer or said second current transducer to said first input of said comparator, in response to the presence of a transient current pulse on said first power line or said second power line, respectively.

* * * * *